United States Patent
Motoyama et al.

(10) Patent No.: US 7,226,561 B2
(45) Date of Patent: Jun. 5, 2007

(54) METHOD OF PRODUCING SILICON CARBIDE SINTERED BODY JIG

(75) Inventors: Tsuyoshi Motoyama, Kodaira (JP); Jin-ichi Taguchi, Kuroiso (JP); Fumio Odaka, Niiza (JP); Toshikazu Shinogaya, Higashikurume (JP)

(73) Assignee: Bridgestone Corporation, Tokyo (JP)

( * ) Notice: Subject to any disclaimer, the term of this patent is extended or adjusted under 35 U.S.C. 154(b) by 113 days.

(21) Appl. No.: 10/506,186

(22) PCT Filed: Mar. 7, 2003

(86) PCT No.: PCT/JP03/02720

§ 371 (c)(1),
(2), (4) Date: Aug. 31, 2004

(87) PCT Pub. No.: WO03/076363

PCT Pub. Date: Sep. 18, 2003

(65) Prior Publication Data

US 2005/0116394 A1    Jun. 2, 2005

(30) Foreign Application Priority Data

Mar. 11, 2002  (JP) ............. 2002-065899
Jun. 11, 2002  (JP) ............. 2002-169656

(51) Int. Cl.
*C04B 41/50*  (2006.01)
*C01B 31/565*  (2006.01)

(52) U.S. Cl. ............ 264/625; 264/29.1; 264/29.6; 264/29.7

(58) Field of Classification Search ........ 264/29.7, 264/29.1, 29.6, 625
See application file for complete search history.

(56) References Cited

U.S. PATENT DOCUMENTS

| 6,387,834 | B1 | 5/2002 | Odaka et al. |
| 6,632,761 | B1 * | 10/2003 | Ushita et al. ......... 501/88 |
| 6,695,984 | B1 * | 2/2004 | Odaka et al. ......... 252/504 |
| 6,699,411 | B2 * | 3/2004 | Odaka et al. ......... 264/29.7 |

FOREIGN PATENT DOCUMENTS

| EP | 357491 A2 | 3/1990 |
| EP | 885859 A2 | 12/1998 |
| JP | 2000-349137 A | 12/2000 |
| JP | 2001-257056 A | 9/2001 |

* cited by examiner

*Primary Examiner*—Chris Fiorilla
*Assistant Examiner*—Carlos Lopez
(74) *Attorney, Agent, or Firm*—Sughrue Mion, PLLC

(57) ABSTRACT

A method of producing a silicon carbide sintered body jig using a reaction sintering method, comprising:
(a) dispersing a silicon carbide powder and an organic substance as a carbon source in a solvent, to produce a mixed slurry powder,
(b) pouring the resulted slurry powder into a mold and drying this to obtain a green body,
(c) temporarily-sintering the resulted green body under a vacuum atmosphere at 1800° C., to obtain a temporarily-sintered body,
(d) temporarily-molding said temporarily-sintered body, to obtain a temporarily-molded body,
(e) impregnating a melted metal silicon into the resulted temporarily-molded body by a capillary phenomenon and reacting free carbon in said temporarily-molded body with silicon sucked into said temporarily-molded body by a capillary phenomenon, to obtain a silicon carbide sintered body, and
(f) subjecting the resulted silicon carbide sintered body to precise processing, to obtain a silicon carbide sintered body jig.

2 Claims, 2 Drawing Sheets

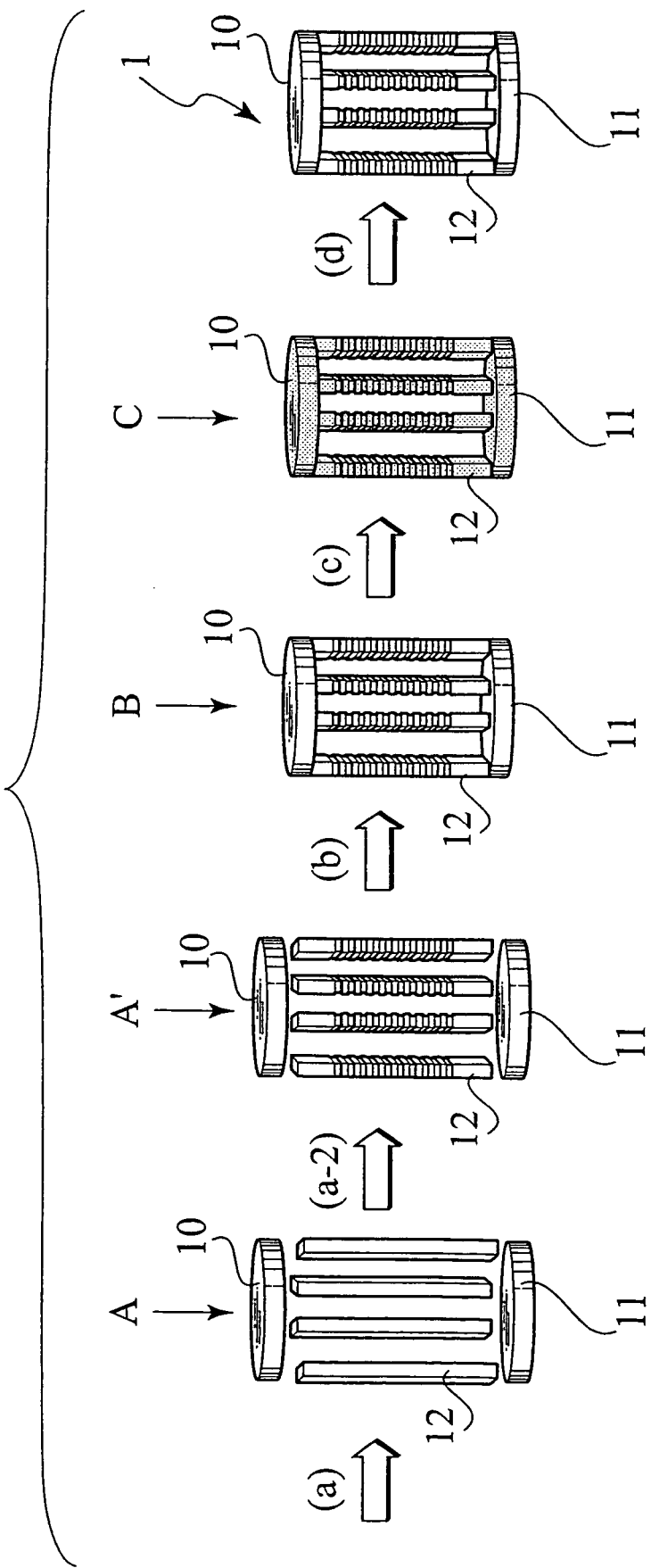

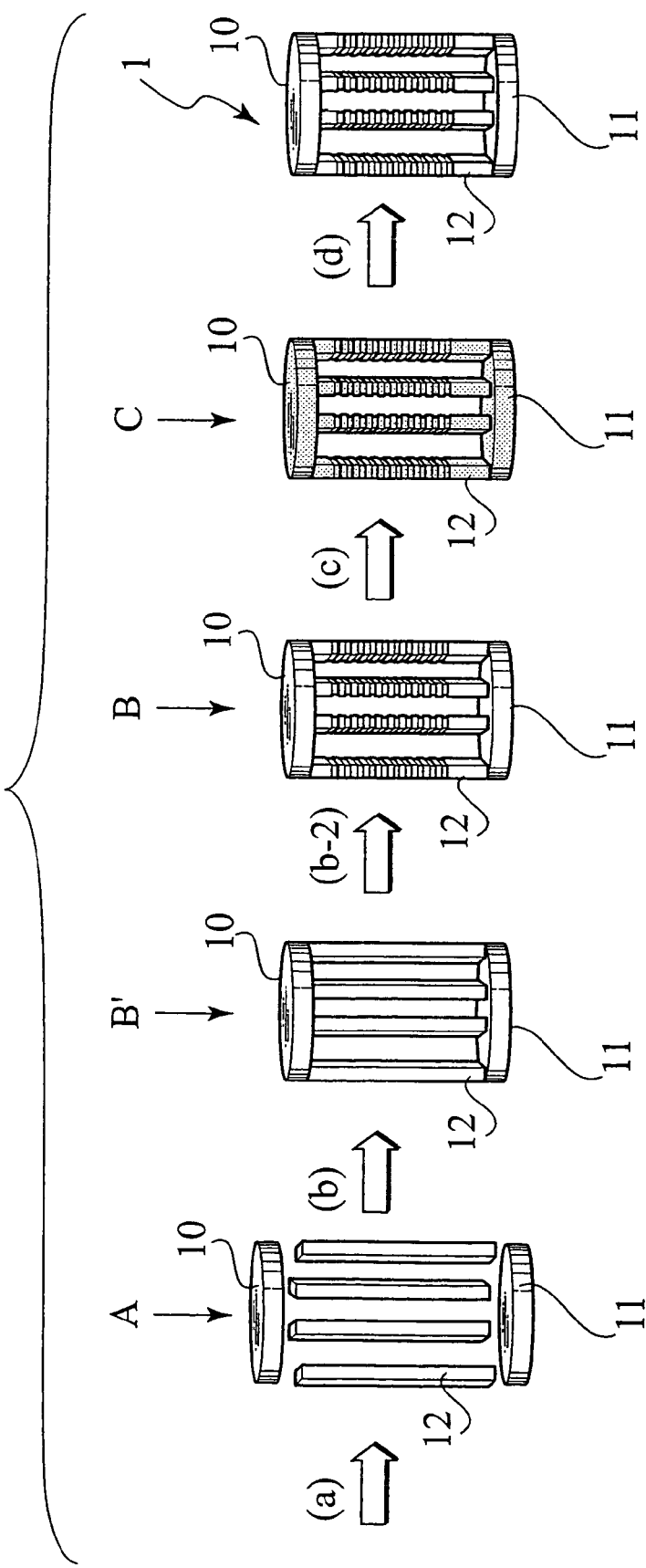

METHOD OF PRODUCING SILICON CARBIDE SINTERED BODY JIG

This application claims the benefit of priority based on Japanese Patent Applications filed prior to this application, namely, Japanese Patent Application No. 2002-65899 (application date., Mar. 11, 2002) and Japanese Patent Application No. 2002-169656 (application date, Jun. 11, 2002), the specifications of which are incorporated herein by reference.

BACKGROUND OF THE INVENTION

1. Field of the Invention

The present invention relates to a method of producing a silicon carbide sintered body jig used for producing semiconductors and a silicon carbide sintered body jig obtained by the above-mentioned production method.

2. Description of the Related Art

Conventionally, silicon carbide sintered bodies are paid to attention as materials used in a high temperature region, due to excellent properties such as high temperature strength, heat resistance, abrasion resistance and chemical resistance. Lately, silicon carbide sintered bodies are used as alternative materials for quartz, as a jig for producing semiconductors.

However, the above-mentioned silicon carbide sintered body obtained by a reaction sintering method needs efforts and time for molding processing due to high strength, consequently, it is required to shorten molding processing time.

Though the present inventors have suggested a method of conducting temporary molding processing at the stage of production of a green body as a means of solving the above-mentioned problem, a considerate care for producing a molded body has been required due to insufficient strength of a green body.

Therefore, there has been a need for a method of trying to shorten processing time while maintaining processing precision of a silicon carbide sintered body.

SUMMARY OF THE INVENTION

According to a first aspect of the invention, there are provided a method of producing a silicon carbide sintered body jig for solving the above-mentioned problem and a silicon carbide sintered body jig obtained by this production method. Namely, the present invention relates to the following items.

(1) A method of producing a silicon carbide sintered body jig using a reaction sintering method, comprising:

(a) dissolving and dispersing a silicon carbide powder and an organic substance as a carbon source in a solvent, to produce a mixed powder in the form of slurry, (b) pouring the resulted mixed powder into a mold and drying this to obtain a green body, (c) temporarily-sintering the resulted green body under a vacuum atmosphere or inert gas atmosphere at 1500° C. to 2000° C., to obtain a temporarily-sintered body, (d) temporarily-molding above-mentioned temporarily-sintered body, to obtain a temporarily-molded body, (e) impregnating a melted metal silicon into the resulted temporarily-molded body by a capillary phenomenon and reacting free carbon in above-mentioned temporarily-molded body with silicon sucked into above-mentioned temporarily-molded body by a capillary phenomenon, to obtain a silicon carbide sintered body, and (f) subjecting the resulted silicon carbide sintered body to precise processing, to obtain a silicon carbide sintered body jig.

(2) The method of producing a silicon carbide sintered body jig according to (1), further comprising (d-2) impregnating the resulted temporarily-molded body with a resin as a carbon source and temporarily-sintering the resulted carbon source-impregnated temporarily molded body under a vacuum atmosphere or inert gas atmosphere at 600 to 2000° C.

(3) The method of producing a silicon carbide sintered body jig according to (1) or (2), wherein above-mentioned silicon carbide powder in above-mentioned step (a) is a silicon carbide powder obtained by a production method comprising (1) a solidification step in which a silicon compound in the form of liquid, an organic compound in the form of liquid producing carbon by heating, and a polymerization or cross-linking catalyst are uniformly mixed to obtain a mixture which is solidified to obtain a solidified material, and (2) a sintering step in which the resulted solidified material is carbonized with heat under a non-oxidizing atmosphere, then, further sintered under a non-oxidizing atmosphere.

(4) The method of producing a silicon carbide sintered body jig according to (2), wherein above-mentioned resin as a carbon source is a phenol resin.

(5) A silicon carbide sintered body jig obtained by the production method according to any one of (1) to (4).

According to the first aspect of the invention, the molding processing time of a silicon carbide sintered body can be shortened by obtaining a silicon carbide sintered body via molding of a temporarily-sintered body having given strength. Further, a silicon carbide sintered body jig having high purity and high corrosion resistance is obtained.

According to a second aspect of the invention, there is provided a method of producing a SiC boat using a reaction sintering method. Namely, the present invention relates to the following items.

(6) A method of producing a SiC boat using a reaction sintering method, comprising:

(a) producing a green body having an upper plate, lower plate and at least three struts and temporarily-sintering the green body to obtain a temporarily-sintered body A, (b) fabricating the resulted temporarily-sintered body A to obtain a temporarily-molded body B, (c) impregnating the resulted temporarily-molded body B with a carbon source to obtain a temporarily-molded body C, and (d) impregnating the resulted temporarily-molded body C with Si or Si-containing substance and reacting above-mentioned carbon source with above-mentioned Si with heat to form SiC.

(7) The method of producing a SiC boat according to (6) further comprising (a-2) processing a groove for supporting a wafer on above-mentioned strut, before production of above-mentioned temporarily-molded body B after production of above-mentioned temporarily-sintered body A.

(8) The method of producing a SiC boat according to (6), further comprising (a-2) processing a groove for supporting a wafer on above-mentioned strut, before production of above-mentioned temporarily-molded body C after production of above-mentioned temporarily-molded body B.

(9) The method of producing a SiC boat according to (7) or (8), having the step of providing a taper at an opening part of above-mentioned groove.

(10) The method of producing a SiC boat according to any one of (6) to (9), wherein in above-mentioned step (c), above-mentioned temporarily-molded body B is impregnated with a phenol resin or acrylonitrile-containing solution as a carbon source to produce a temporarily-molded body C.

(11) The method of producing a SiC boat according to any one of (6) to (10), wherein in above-mentioned step (c), the carbon source-impregnated temporarily-molded body obtained by impregnating a carbon source into above-mentioned temporarily-molded body B is temporarily-sintered under a vacuum atmosphere or inert gas atmosphere at 600 to 2000° C. to produce a temporarily-molded body C.

(12) The method of producing a SiC boat according to any one of (6) to (11), wherein in above-mentioned step (d), the surface of above-mentioned temporarily-molded body C is coated with Si or Si-containing substance by a CVD treatment or spray treatment, and carbon on the surface of the temporarily-molded body C and above-mentioned Si are reacted with heat to form a SiC-rich layer on the surface of the temporarily-molded body C.

(13) The method of producing a SiC boat according to any one of (6) to (11), wherein in above-mentioned step (d), the surface of above-mentioned temporarily-molded body C is impregnated with Si or Si-containing substance by a CVD treatment or spray treatment, and carbon on the surface of the temporarily-molded body C and above-mentioned Si are reacted with heat to form a SiC-rich layer on the surface of the temporarily-molded body C.

(14) The method of producing a SiC boat according to any one of (6) to (11), wherein in above-mentioned step (d), the temporarily-molded body C is inpregnated with Si or Si-containing substance, and carbon of the temporarily-molded body C and above-mentioned Si are reacted with heat to form a SiC.

(15) A SiC boat produced by the production method according to any one of (6) to (14).

According to the second aspect of the invention, an action effect is obtained that the density and corrosion resistance of the surface of a SiC boat are improved. There is also obtained an action effect that processing time is shortened and processing facilities are simplified by improvement of the processability of a SiC boat.

According particularly to the above-mentioned 12-th invention having a process of providing a SiC-rich layer, an action effect is obtained that the strength of a SiC boat is improved and a surface protective layer is formed on the surface of a SiC boat.

In the present invention, "green body" means a silicon carbide molded body before a sintering reaction containing a lot of pores, obtained by removing a solvent from a mixed powder in the form of slurry. In the present invention, "temporarily-sintered body" means a silicon carbide molded body before a sintering reaction containing a lot of pores and from which a pure substance has been removed, obtained by temporarily-sintering the above-mentioned green body.

BRIEF DESCRIPTION OF THE DRAWINGS

FIG. 1 shows a process of producing a SiC boat 1.
FIG. 2 shows a process of producing a SiC boat 1.

DESCRIPTION OF THE PREFERRED INVENTION

The present invention will be illustrated further in detail below.

First, components used for production of a silicon carbide sintered body jig of the present invention are described.

(Silicon Carbide Powder)

As the silicon carbide powder used in the present invention, α type, β type, amorphous or mixtures thereof are listed. For obtaining a silicon carbide sintered body of high purity, it is preferable to use a silicon carbide powder of high purity as a raw material silicon carbide powder.

This β type silicon carbide powder is not particularly restricted in its grade, and for example, commercially available β type silicon carbides can be generally used.

A silicon carbide powder of high purity can be obtained, for example, by dissolving a silicon source containing at least one silicon compound, a carbon source containing at least one organic compound producing carbon by heating, and a polymerization or cross-linking catalyst in a solvent, drying the solution, then, sintering the resulted powder under a non-oxidizing atmosphere.

As the above-mentioned silicon source containing a silicon compound (hereinafter, referred to as "silicon source"), those in liquid form and those in solid form can be used together, however, at least one silicon compound should be selected from those in liquid form. As the liquid silicon source, polymers of alkoxysilanes (mono-, di-, tri-, tetra-) and tetraalkoxysilanes are used. Among alkoxysilanes, tetraalkoxysilanes are suitably used, and specific examples thereof include methoxysilane, ethoxysilane, propoxysilane, butoxysilane and the like, and from the standpoint of handling, ethoxysilane is preferable. Regarding the polymer of a tetraalkoxysilane, polymers of low molecular weight having a degree of polymerization of about 2 to 15 (oligomers) and silic acid polymers having higher degree of polymerization in the form of liquid are mentioned. As the polymer in the form of solid which can be used together with them, silicon oxides are mentioned. The silicon oxides in the above-mentioned reaction sintering method include silica gel (colloidal ultrafine silica-containing liquid, containing a OH group or alkoxyl group inside), silicon dioxide (silica gel, fine silica, quarts powder) and the like, in addition to SiO. These silicon sources may be used singly or in combination of two or more.

Among these silicon sources, an oligomer of tetraethoxysilane, a mixture of an oligomer of tetraethoxysilane and fine powdery silica, and the like are suitable, from the standpoint of excellent uniformity and handling property. As these silicon sources, substances of high purity are used, and the initial impurity content thereof is preferably 20 ppm or less, further preferably 5 ppm or less.

The polymerization and cross-linking catalyst used in producing a silicon carbide powder of high purity can be suitably selected depending on the carbon source, and when the carbon source is a phenol resin or furan resin, listed are acids such as toluenesulfonic acid, toluenecarboxylic acid, acetic acid, oxalic acid and sulfuric acid. Of them, toluenesulfonic acid is suitably used.

The ratio of carbon to silicon (hereinafter, abbreviated as C/Si ratio) in the above-mentioned process of producing a silicon carbide powder of high purity which is a raw material powder used in the reaction sintering method is defined by element analysis of a carbide intermediate obtained by carbonizing a mixture at 1000° C. Stoichiometrically, the free carbon content in a silicon carbide produced when the C/Si ratio is 3.0 should be 0%, however, actually, free carbon is generated at lower C/Si ratio by vaporization of a SiO gas produced simultaneously. It is important to previously determine proportion thereof lest the free carbon amount in this produced silicon carbide powder should be an amount not suitable for use of production of a sintered body and the like. Usually, in sintering at 1600° C. or more around 1 atm, free carbon can be suppressed when the C/Si ratio is 2.0 to 2.5, and this range can be used suitably. When the C/Si ratio is 2.55 or more, free carbon increases remarkably, however, since this free carbon has an effect of suppressing growth of grains, the ratio may be suitably selected depending on the object of formation of grains. Here, when the pressure of an atmosphere is lower or higher, the C/Si ratio for obtaining a pure silicon carbide varies, therefore, the C/Si ratio is not necessarily limited to the above-mentioned range, in this case.

As described above, as the method of obtaining a silicon carbide powder of particularly high purity, there can be utilized a method of producing a raw material powder described in a method of producing a single crystal according to Japanese Patent Application Laid-Open (JP-A) No. 9-48605 previously filed by the present applicant, namely, a method of producing a silicon carbide powder of high purity comprising a silicon carbide producing process in which one or more selected from tetraalkoxysilanes of high purity and tetraalkoxysilane polymers are used as a silicon source, an organic compound of high purity producing carbon by heating is used as a carbon source, and these are uniformly mixed to obtain a mixture which is calcined with heating under a non-oxidizing atmosphere, to obtain a silicon carbide powder, and a post treatment process in which the resulted silicon carbide powder is kept at temperatures of 1700° C. or more and less than 2000° C., and during keeping the temperature, a treatment of heating at temperatures of 2000° C. to 2100° C. for 5 to 20 minutes is conducted at least once, wherein a silicon carbide powder having a content of each impurity element of 0.5 ppm or less is obtained by effecting the above-mentioned two processes, and the like. Thus obtained silicon carbide powder has uniform size, therefore, a treatment is so conducted that the above-mentioned particle size is satisfied by powder decomposition and classification.

In the case of introduction of nitrogen in a process of producing a silicon carbide powder, a silicon source, a carbon source, an organic substance composed of a nitrogen source, and a polymerization or cross-linking catalyst are uniformly mixed, however, it is preferable to effect thorough mixing with a silicon source such as an oligomer of tetraethoxysilane, in dissolving a carbon source such as a phenol resin, an organic substance composed of a nitrogen source such as hexamethylenetetramine, and a polymerization or cross-linking catalyst such as toluenesulfonic acid, in a solvent such as ethanol, as described above.

(Carbon Source)

The substance used as a carbon source is an organic compound of high purity containing oxygen in the molecule and having carbon left by heating, and specific examples thereof include a phenols resin, furan resin, acrylonitrile resin, epoxy resin, phenoxy resin and, various saccharides such as mono-saccharides such as glucose, oligo-saccharides such as sucrose and the like, poly-saccharides such as cellulose and starch. As these compounds, there are mainly used those which are liquid at ambient temperature, those which are dissolved in a solvent, and those which are softened or liquefied by heating such as thermoplastic compounds or heat melting compounds, for the purpose of uniform mixing with a silicon source, and of them, resol type phenol resins and novolak type phenol resin are suitable. Particularly, resol type phenol resins are suitably used.

(Silicon Source)

As the silicon source, one or more selected from tetraalkoxysilanes of high purity, polymers thereof and silicon oxides are used. In the present invention, the silicon oxides include silicon dioxide and silicon mono-oxide. Specific examples of the silicon source include alkoxysilanes typified by tetraethoxysilane, lower molecular weight polymers (oligomers) thereof, and silic acid polymers and the like having higher degree of polymerization, and silicon oxide compounds such as silica sol, fine powdery silica and the like. As the alkoxysilane, methoxysilen, ethoxysilane, propoxysilane and butoxysilane are exemplified, and of them, ethoxysilane is preferably used from the standpoint of handling property.

Here, the oligomer indicates polymers having a degree of polymerization of about 2 to 15. Of these silicon sources, an oligomer of tetraethoxysilane, a mixture of an oligomer of tetraethoxysilane with fine powdery silica, and the like are suitable, from the standpoint of excellent uniformity and handling property. As these silicon sources, substances of high purity are used, and the initial impurity content is preferably 20 ppm or less, further preferably 5 ppm or less.

[Method of Producing Silicon Carbide Sintered Body Jig]

Subsequently, the method of producing a silicon carbide sintered body jig by a reaction sintering method according to the present invention will be illustrated by preferable embodiments. It is needless to say that the present invention is not limited to the following embodiments.

(Emboidiment 1)

The method of producing a silicon carbide sintered body jig as an embodiment 1 of the present invention comprises the steps of: (a) dissolving and dispersing a silicon carbide powder and an organic substance as a carbon source in a solvent, to produce a mixed powder in the form of slurry, (b) pouring the resulted mixed powder into a mold and drying this to obtain a green body, (c) temporarily-sintering the resulted green body under a vacuum atmosphere or inert gas atmosphere at 1500° C. to 2000° C., to obtain a temporarily-sintered body, (d) temporarily-molding the above-mentioned temporarily-sintered body, to obtain a temporarily-molded body, (e) impregnating a melted metal silicon into the resulted temporarily-molded body by a capillary phenomenon and reacting free carbon in the above-mentioned temporarily-molded body with silicon sucked into the above-mentioned temporarily-molded body by a capillary phenomenon, to obtain a silicon carbide sintered body, and (f) subjecting the resulted silicon carbide sintered body to precise processing, to obtain a silicon carbide sintered body jig.

According to the embodiment 1 of the present invention, there is obtained an action effect that processing time required for precise processing of a silicon carbide sintered body could be significantly shortened, by provision of the above-mentioned process (d).

Detailed descriptions will be made below on each process in the embodiment 1 of the method of producing a silicon carbide sintered body jig.

(a) Regarding Process of Producing Mixed Powder in the Form of Slurry

A mixed powder in the form of slurry is produced by dissolving or dispersing a silicon carbide powder and an organic substance in a solvent. Pores can be dispersed uniformly in a green body by sufficient stirring and mixing in dissolution and dispersion. As the above-mentioned solvent, water and lower alcohols such as ethyl alcohol, ethyl ether, acetone and the like are listed. As the solvent, those having low impurity content are preferably used. As the above-mentioned organic substance, phenol resins, polyvinyl alcohol, acrylic polymers and the like can be used.

Additionally, a dispersing agent and de-foaming agent may be added. As the dispersing agent, a polyacrylic acid ammonium salt and the like are suitably used.

The above-mentioned stirring and mixing can be conducted by known stirring and mixing means, for example, a mixer, planetary ball mill and the like.

(b) Regarding Process of Obtaining Green Body

For obtaining a green body from a mixed powder in the form of slurry, casting molding is suitably used, in general. A green body having determined size can be obtained by pouring a mixed powder in the form of slurry into a mold in casting molding, leaving this and releasing this from the mold, then, removing a solvent by natural drying or drying under heat.

(c) Process of Obtaining Temporarily-sintered Body

For obtaining a silicon carbide sintered body having high bending strength, it is preferable to temporarily-sinter a green body before calcination. By this temporarily-sintering process, a trace amount of water which could not be removed only by drying and organic components can be removed completely.

The temporarily-sintering temperature is from 1500 to 2000° C., preferably 1700 to 1900° C. When lower than 1500° C., connection between silicon carbide powders in a green body is not promoted sufficiently and bending strength becomes deficient, leading to poor handling, and when higher than 2000° C., decomposition of SiC on the surface of a temporarily-sintered body becomes remarkable and an excellent temporarily-sintered body cannot be obtained.

The time of keeping the maximum temperature of the temporarily-sintering is preferably from 1 to 10 hours, and may be advantageously determined appropriately in view of the form, dimension and the like of green body. It is suitable that the above-mentioned temporarily-sintering is conducted under a vacuum atmosphere or inert gas atmosphere.

(d) Regarding Process of Obtaining Temporarily-molded Body

A temporarily-sintered body obtained by the above-mentioned processes (a) to (c) is appropriately subjected to grinding, cutting, connecting and the like using conventionally known production methods and apparatuses, to complete a final form. It is needless to say that temporarily-molding is conducted based on knowledge of those skilled in the art in view of deformation of a molded body in sintering.

(e) Regarding Process of Obtaining Silicon Carbide Body

A temporarily-molded body produced via the above-mentioned processes is heated under a vacuum atmosphere or inert gas atmosphere up to not lower than the melting point of metal silicon of high purity, specifically 1420 to 2000° C., preferably 1450 to 1700° C. to be immersed in melted metal silicon of high purity. By immersion of a temporarily-molded body in melted metal silicon, silicon in the form of liquid permeates into pores in a temporarily-molded body by a capillary phenomenon and this silicon and free carbon in the temporarily-molded body react. By this reaction, silicon carbide is produced, and pores in the temporarily-molded body are filled with silicon carbide.

The time of immersing a temporarily-molded body into melted metal silicon is not particularly restricted, and is appropriately determined depending on size and the amount of free carbon in a temporarily-molded body. Metal silicon of high purity is melted by heating at 1420 to 2000° C., 1450 to 1800° C., preferably 1500 to 1700, 1580 to 1650° C., and when this melt temperature is lower than 1420° C., the viscosity of metal silicon of high purity increases and consequently it does not permeate into the temporarily-molded body by a capillary phenomenon, and when higher than 2000° C., vaporization becomes remarkable and a furnace body and the like are damaged.

As the metal silicon of high purity, metal silicon in the form of powder, granule and block are listed, and metal silicon in the form of block of 5 to 30 mm is suitably used. In the present invention, high purity means impurity content of less than 1 ppm.

A silicon carbide sintered body of high purity is obtained by reaction of free carbon contained in a temporarily-molded body with silicon and burying of pores in a temporarily-molded body with the produced silicon carbide, as described above.

By the above-mentioned reaction sintering method, a silicon carbide sintered body of high purity and high density can be obtained. If the above-mentioned heating conditions of the present invention can be satisfied in the above-mentioned reaction sintering method, the production apparatus and the like are not particularly limited, and known heating furnaces and reaction apparatuses can be used.

(f) Regarding precise processing process

The reaction sintered body obtained via the above-mentioned processes is appropriately subjected to precise processing such as grinding, polishing and the like using conventionally known technologies and apparatuses, to obtain a silicon carbide sintered body jig.

(Embodiment 2)

For a silicon carbide sintered body of silicon impregnation type, further improvement in corrosion resistance against an acid has been required. Then, the present inventors have investigated in view of increasing the SiC density on the surface of a silicon carbide sintered body and resultantly found that the SiC density on the surface of a silicon carbide sintered body can be enhanced simply by forming a carbon-rich layer on the surface of a silicon carbide sintered body by providing a process (d-2) described later, completing the invention of the embodiment 2.

That is, the method of producing a silicon carbide sintered body jig as the embodiments 2 of the present invention further comprises the step of (d-2) impregnating the resulted temporarily-molded body with a resin as a carbon source and temporarily-sintering the resulted carbon source-impregnated temporarily molded body under a vacuum atmosphere or inert gas atmosphere at 600 to 2000° C., in addition to the process described in the above-mentioned embodiment 1. This process (d-2) is conducted prior to a process (e) after the processes (a) to (d) described in the above-mentioned embodiment 1.

By thus providing the above-mentioned process (d-2), there is obtained an action effect that the corrosion resistance of a silicon carbide sintered body jig is improved in addition to the effect obtained in the-above-mentioned embodiment 1.

The temporary sintering temperature is 600 to 2000° C., preferably 900 to 2000° C., further preferably 900 to 1800° C. When lower than 600° C., a resin as a carbon source is not carbonized sufficiently, and when higher than 2000° C., decomposition of SiC on the surface of a temporarily-sintered body becomes remarkable.

The time of keeping the maximum temperature of the temporarily-sintering is preferably from 1 to 10 hours, and may be advantageously determined appropriately in view of the form, dimension and the like of a temporarily-molded body. It is suitable that the above-mentioned temporarily-sintering is conducted under a vacuum atmosphere or inert gas atmosphere.

As the substance used as a carbon source, those described in the above-mentioned column of (carbon source) can be used without particular restriction, and a phenol resin is suitably used in view of high carbon remaining ratio.

Thus obtained silicon carbide sintered body jig is sufficiently densified and the density of the surface is 3.10 g/cm$^3$ or more.

When the resulted sintered body is a porous body, heat resistance, oxidation resistance, chemical resistance and mechanical strength are poor and washing thereof is difficult. Further, it leads to have poor physical properties such as presence of fine fragments that are produced as pollution substances due to occurrence of fine cracking and generation of gas permeability, thereby problems such as limitation of use and the like occur. A silicon carbide sintered body jig of the present invention does not tend to cause the above-mentioned problems ascribable to its porous structure.

The total content of impurities of in a silicon carbide sintered body jig obtained in the present invention is less than 5 ppm, preferably less than 3 ppm, more preferably less than 1 ppm. From the standpoint of application to the field of semiconductor industry, these amount of impurity contents by chemical analysis are only reference values. Practically, evaluation differs also depending on whether impurities are uniformly distributed, and whether impurities are locally present. Therefore, those skilled in the art evaluate to what extent impurities pollute a wafer in general under given heat conditions using a practical apparatus, by various means. The total content of impurities other than silicon, carbon and oxygen contained in a silicon carbide sintered body jig can be made lower than 1 ppm by a production method comprising a sintering process in which a silicon compound in the form of liquid, a non-metal-based sintering aid, and a polymerization or cross-linking catalyst are uniformly mixed to obtain solid which is carbonized with heat under a non-oxidizing atmosphere, then, further calcined under a non-oxidizing atmosphere.

The silicon carbide sintered body jig obtained by the above-mentioned production method is subjected to treatments such as processing, grinding and washing, depending on use object.

For obtaining a silicon carbide sintered body jig in the form of slice, a cylindrical sample (sintered body) is formed and this is slice-processed along the diameter direction, and as this processing method, discharge processing is suitably used. This is used for semiconductor production parts, electronic information instrument parts and the like.

Here, examples of main semiconductor production apparatuses in which a part made of a sintered body according to the present invention is used include exposure apparatuses, resist treatment apparatuses, dry etching apparatuses, washing apparatuses, heat treatment apparatuses, ion injection apparatuses, CVD apparatuses, PVD apparatuses, dicing apparatuses and the like, and examples of parts include plasma electrodes for a dry etching apparatus, protective rings (focus ring), slit parts (aperture) for an ion injection apparatus, protective plates for an ion generation part and mass spectrometry part, dummy wafers used in wafer treatment in heat treatment apparatuses and CVD apparatuses and exothermic heaters in CVD apparatuses and PVD apparatuses, particularly, heaters directly heating a wafer at its lower part, and the like.

As the electronic information instrument parts, disc substrates and thin film magnetic head substrates for hard disc apparatuses, and the like are listed, and sputtering targets for forming a thin film for a photomagnetic disc surface and various sliding surfaces are also included in these parts.

The optical parts can be used also in reflection mirrors for synchrotron radiation (SR), laser ray and the like.

In the production method of the present invention, the production apparatuses and the like are not particularly limited providing the above-mentioned heating conditions of the present invention are satisfied, and in view of the pressure resistance of a mold for sintering, known heating furnaces and reaction apparatuses can be used.

[Method of Producing SiC Boat]

Subsequently, preferable embodiments of a method of producing a SiC boat will be illustrated referring to FIGS. 1 and 2, as examples of the method of producing a silicon carbide sintered body using a reaction sintering method according to the present invention.

(Embodiment 3)

A SiC boat 1 as an embodiment 3 of the present invention has, as shown in FIG. 1, (a) a process of producing a green body having an upper plate 10, lower plate 11 and struts 12, temporarily-sintering the resulted green body to obtain a temporarily-sintered body A; (a-2) a process of processing grooves for supporting a wafer on the above-mentioned struts 12 of the above-mentioned temporarily-sintered body A to obtain a temporarily-sintered body A'; (b) a process of fabricating the above-mentioned temporarily-sintered body A' to obtain a temporarily-sintered body B; (c) a process of impregnating a carbon source into the above-mentioned temporarily-sintered body B to obtain a temporarily-sintered body C; and (d) a process of impregnating Si or Si-containing substance into the above-mentioned temporarily-sintered body C and heat-reacting the above-mentioned carbon source with the above-mentioned Si to form SiC. Hereinafter, the method of producing a SiC boat 1 will be illustrated in detail for every process.

(a) Regarding Process of Obtaining Temporarily-sintered Body A

First, a mixed powder in the form of slurry is produced. In this case, a mixed powder in the form of slurry is produced by dissolving or dispersing a silicon carbide powder, a carbon source and, if necessary, an organic binder and de-foaming agent in a solvent.

As the silicon carbide powder and carbon source, those explained above can be used. As the above-mentioned solvent, listed are water, lower alcohols such as ethyl alcohol and the like, and ethyl ether, acetone and the like. It is preferable to use a solvent having lot impurity content.

In producing a mixed powder in the form of slurry from a silicon carbide powder, an organic binder may be added. As the organic binder, a deflocculant, powder sticker and the like are listed, and as the deflocculant, nitrogen-based compounds are preferable for further increasing an effect of imparting conductivity, and for example, ammonia, ammonium polyacrylate salt, and the like are suitably used. As the powder sticker, polyvinyl alcohol urethane resins (for example, water-soluble polyurethane) and the like are suitably used. Additionally, a de-foaming agent may be added. As the de-foaming agent, a silicone de-foaming agent and the like are listed.

The above-mentioned stirring and mixing can be conducted by known stirring and mixing means, for example, a mixer, planetary ball mill and the like.

Subsequently, the mixed powder in the form of slurry prepared as describe above is poured into a mold, and molded to obtain green bodies of an upper plate 10, lower plate 11 and strut 12. In this case, for pouring a mixed powder in the form of slurry and molding this, cast molding is suitably used, in general. A mixed powder in the form of slurry is poured into a mold in cast molding, left and released from the mold, then, a solvent is removed by natural drying or heat drying, then, mechanical processing or the like is conducted, thus, a green body having a determined size can be obtained. The number of struts is not particularly restricted providing struts can support a wafer, and a number of at least three or more is necessary.

Thus obtained green body is temporarily-sintered to obtain a temporarily-sintered body A. By temporarily-sintering a greenbody, a temporarily-sintered body A having higher bending strength is obtained, and subsequent fabrication of a temporarily-molded body can be made easy. By this temporarily-sintering process, a trace amount of water which could not be removed completely only by drying, and organic components such as a deflocculant and binder can be removed completely.

The temporarily-sintering temperature is from 1500 to 2000° C., preferably from 1700 to 1900° C. When lower than 1500° C., connection between silicon carbide powders in a green body is not promoted sufficiently, bending strength becomes insufficient, and handling thereof becomes inconvenient. When over 2000° C., decomposition of a silicon carbide becomes violent. The time of keeping the maximum temperature of the above-mentioned temporarily-sintering may be advantageously determined appropriately in view of the form, dimension and the like of green body. It is suitable that the above-mentioned temporarily-sintering is conducted under a vacuum atmosphere or inert gas atmosphere from the standpoint of prevention of oxidation. By this temporarily-sintering, a temporarily-sintered body showing excellent processability and having a bending strength at room temperature of 100 MP or more can be obtained. This enables processing of complicated form by a machine.

(a-2) Regarding Groove Processing Process

Grooves for supporting a wafer are processed on the above-mentioned strut 12 of the above-mentioned temporarily-sintered body A according to a conventionally known method. The width and depth of grooves and interval between grooves are not particularly restricted, and determined depending on the thickness and size of a wafer accommodated. In this case, it is preferable to provide taper on an opening of the above-mentioned groove using a conventionally known method, from the standpoint of prevention of stress concentration. R angle of this taper part is not particularly restricted and determined depending on the thickness and size of a wafer accommodated.

(b) Regarding Process of Obtaining Temporarily-molded Body B

Parts constituting the resulted temporarily-molded body A are connected according to a conventionally known method to fabricate a temporarily-molded body B. In this case, it is preferable that connection is conducted using the slurry mixed powder described above as glue. In connecting, processing such as grinding and the like may be performed arbitrarily.

(c) Regarding Process of Obtaining Temporarily-molded Body C

The resulted temporarily-molded body B is impregnated with a carbon source to obtain a temporarily-molded body C.

In this case, as the carbon source to be impregnated into the above-mentioned temporarily-molded body B, those described above can be used, and of them, a phenol resin or acrylonitrile-containing solution is preferably impregnated from the standpoint of high actual carbon ratio and easy handling.

(d) Regarding Process of Obtaining SiC Boat 1

The temporarily-molded body C produced via the above-mentioned processes is impregnated, under a vacuum atmosphere or inert gas atmosphere, into high purity metal silicon melted by heating at temperatures not lower than the melting point of the high purity metal silicon, specifically from 1420 to 2000° C., preferably 1450 to 1700° C. By impregnation of the temporarily-molded body C into the melted metal silicon, silicon in the form of liquid permeates into pores in the temporarily-molded body C by a capillary phenomenon and this silicon reacts with free carbon in the temporarily-sintered body. By this reaction, a silicon carbide is produced, and pores in the temporarily-sintered body are filled with the produced silicon carbide.

Since the reaction of silicon with free carbon occurs at about 1420 to 2000° C. as shown in the process of producing a silicon carbide powder, the reaction with free carbon progresses at a stage of immersed into the temporarily-molded body with the melted high purity metal silicon heated at 1420 to 2000° C., preferably 1450 to 1700° C.

The time of impregnation of the temporarily-molded body C into the melted metal silicon is not particularly restricted, and appropriately determined depending on size and the amount of free carbon in the temporarily-molded body C. Though the high purity metal silicon is melted by heating at 1420 to 2000° C., 1450 to 1700° C., preferably 1500 to 1700° C., 1550 to 1650° C., and when this melting temperature is lower than 1420° C., the viscosity of the high purity metal silicon increases, consequently, it does not permeate into the temporarily-molded body C by a capillary phenomenon, and when over 2000° C., vaporization becomes remarkable, to impart damage to a furnace body and the like.

As the high purity metal silicon, metal silicons in the form of powder, granule and block are listed, and metal silicon in the form of block of 2 to 5 mm is suitably used. In the present invention, high purity means impurity content of less than 1 ppm.

By reaction of free carbon contained in the temporarily-molded body C with silicon and embedding pores in the temporarily-sintered body with the produced silicon carbide as described above, a SiC boat is obtained constituted of a silicon carbide sintered body having high purity, high density and high corrosion resistance.

(Embodiment 4)

It is preferable that, in the process (d) of the embodiment 3, Si is coated or impregnated onto the surface of the temporarily-molded body C by CVD treatment or spray treatment, and carbon on the surface of the temporarily-molded body C and the above-mentioned Si are reacted under heat, to form a SiC-rich layer on the surface of the temporarily-molded body C. By formation of a SiC-rich layer on the surface of the temporarily-molded body C, an action effect is obtained that the corrosion resistance of the temporarily-molded body C is improved. In this case, the above-mentioned CVD treatment or spray treatment is conducted based on a conventional method using a conventionally known apparatus. The heating temperature in forming a SiC-rich layer is from 1420 to 2000° C., preferably 1450 to 1700° C.

A SiC boat made of the temporarily-sintered body obtained by the above-mentioned production method is subjected to treatments such as processing, grinding, washing and the like appropriately according to conventionally known methods.

The method of producing a SiC boat according to the present invention has been illustrated referring to embodiments, however, it is needless to say that the present invention is not limited to the above-mentioned embodiments. The following embodiment is also envisaged.

(Embodiment 5)

In the embodiment 3, grooves have been processed on the temporarily-sintered body A before fabrication of the temporarily-molded body B, however, grooves may be processes on a temporarily-molded body B' as shown in FIG. 2.

Though the above-mentioned embodiments 3 to 5 show a method of producing a vertical SiC boat, it is needless to say that a horizontal SiC boat is produced according to the present invention. For producing a horizontal SiC boat, it is necessary to prepare both side plates as parts constituting a temporarily-sintered body A.

By a production method using the above-mentioned reaction sintering method, a SiC boat can be obtained constituted of a silicon carbide sintered body having high purity, high density, high toughness and electric conductivity. In the above-mentioned reaction sintering method, the production apparatus and the like are not particularly restricted providing the above-mentioned heating conditions of the present invention are satisfied, and known heating furnaces and reaction apparatuses can be used.

The surface of the SiC boat constituted of thus obtained silicon carbide sintered body is highly densified sufficiently, and the density is 3.1 g/cm$^3$ or more. When the density is less than 3.1 g/cm$^3$, corrosion resistance is poor, a metal silicon part tends to be eluted by an acid and the like, particle increases, and a pollution property deteriorates. It is judged that a SiC boat constituted of the silicon carbide sintered body of the present invention has an excellent dynamic property and electric property. The density of a SiC boat constituted of the silicon carbide sintered body of the present invention in a preferable embodiment is 3.15 g/cm$^3$ or more.

When the resulted sintered body is a porous body having aventilation property, heat resistance, oxidation resistance, chemical resistance and mechanical strength are poor, and washing is difficult. If the resulted sintered body is a porous body, heat resistance, oxidation resistance, chemical resistance and mechanical strength are poor and washing thereof is difficult. Further, it leads to have poor physical properties such as presence of fine fragments that are produced as pollution substances due to occurrence of fine cracking and generation of gas permeability, thereby problems such as limitation of use and the like occur. In the case a SiC boat constituted of the silicon carbide sintered body of the present invention, the above-mentioned problems ascribable to porous body do not occur easily.

The total content of impurities of a SiC boat constituted of the silicon carbide sintered body obtained in the present invention is less than 5 ppm, preferably less than 3 ppm, more preferably less than 1 ppm, and from the standpoint of application to the semiconductor industry field, the amount of impurity content by these chemical analyses has only a meaning as a reference value. Practically, its evaluation varies also depending on whether impurities are uniformly distributed and whether impurities are locally present. Therefore, those skilled in the art evaluate to what extent impurities pollute a wafer under given heating conditions generally using a practical apparatus, by various means.

Additionally, as a result of investigation of the preferable physical properties of a SiC boat constituted of the silicon carbide sintered body obtained in the present invention, for example, the bending strength at room temperature is 400 to 700 MPa, the Vickers hardness is 1500 kgf/mm$^2$ or more, the Poisson's ratio is 0.14 to 0.21, the thermal expansion coefficient is $3.8\times10^{-6}$ to $4.5\times10^{-6}$ (° C.$^{-1}$), the heat conductivity is 150 W/m·k or more, and the specific heat is 0.60 to 0.70 J/g·K.

A SiC boat constituted of the silicon carbide sintered body of the present invention obtained as described above has suitably the following physical properties.

A SiC boat constituted of the silicon carbide sintered body of the present invention has a volume resistivity of 1 Ωcm or less, in a further preferable embodiment, 0.5 to 0.05 Ωcm.

A SiC boat constituted of the silicon carbide sintered body of the present invention has a total content of impurity elements other than silicon and carbon in a silicon carbide sintered body of less than 5 ppm.

A SiC boat constituted of the silicon carbide sintered body of the present invention has a surface density of 2.9 g/cm$^3$ or more, in a preferable embodiment, 3.00 to 3.15 g/cm$^3$, in a further preferable embodiment, 3.15 g/cm$^3$ or more.

In the production method of the present invention, the production apparatus and the like are not particularly restricted providing the above-mentioned heating conditions of the present invention are satisfied, and known heating furnaces and reaction apparatuses can be used.

Regarding the purity of a silicon carbide powder as a raw material powder of the present invention, a silicon source and non-metal sintering aid for producing the raw material powder, and an inert gas used for producing a non-oxidizing atmosphere, the content of each impurity element is preferably 1 ppm or less, however, the content is not necessarily limited to this range providing it is in a permissible range of purification in a heating and sintering process. Here, the impurity element belongs to groups I to XVI elements in the periodic table according to 1989 IUPAC Nomenclature of Inorganic Chemistry (revision), and has an atomic number of 3 or more, excluding elements having an atomic number of 6 to 8 and 14 to 16.

EXAMPLES

The following examples and comparative examples will illustrate the present invention specifically, however, it is needless to say that the invention is not limited to the following examples.

[Method of Producing Silicon Carbide Reaction Sintered Body Jig]

A method of producing a silicon carbide reaction sintered body jig is illustrated referring to Examples 1 and 2 and Comparative Example 1.

Example 1

First, to 100 parts of a high purity silicon carbide powder having a central particle size of 2.1 μm (silicon carbide having an impurity content of 5 ppm or less produced according to a production method described in JP-A No. 9-48605) was added 40 parts of water, 0.3 parts of deflocculant and 3 parts of a binder, further, they were dispersed and mixed in a ball mill for 24 hours, to obtain a mixed powder in the form of slurry having a viscosity of 15 poise, as a silicon carbide powder.

This mixed powder in the form of slurry was cast into a gypsum mold having a length of 60 mm, a width of 10 mm and a thickness of 5 mm, and naturally dried at 22° C. for 24 hours, to obtain a green body.

Next, the resulted green body was heated up to 1800° C. under a vacuum atmosphere, and temporarily-sintered at the above-mentioned temperature for 1 hour to obtain a temporarily-sintered body.

On the resulted temporarily-sintered body, temporarily-molding processing was performed to form grooves having a depth of 30 mm at an interval of 6 mm using a machining center equipped with a diamond grinder having a width of 3 mm.

Then, a Si impregnation treatment was conducted at 1540° C. using metal silicon as a Si source, to obtain a reaction sintered body jig.

Finally, the resulted reaction sintered body jig was precisely-processed, to obtain a silicon carbide reaction sintered body jig.

Example 2

A temporarily-molded body was obtained in the same manner as in Example 1, then, a phenol resin as a carbon source was impregnated into the temporarily-molded body to obtain a carbon source-impregnated temporarily-molded body which was temporarily-sintered at 1800° C. under a vacuum atmosphere or inert gas atmosphere.

Then, a Si impregnation treatment was conducted at 1540° C. using metal silicon as a Si source. The resulted reaction sintered body jig was precisely-processed, to obtain a silicon carbide reaction sintered body jig.

Comparative Example 1

First, to 100 parts of a high purity silicon carbide powder having a central particle size of 2.1 μm (silicon carbide having an impurity content of 5 ppm or less produced according to a production method described in JP-A No. 9-48605) was added 40 parts of water, 0.3 parts of deflocculant and 3 parts of a binder, further, they were dispersed and mixed in a ball mill for 24 hours, to obtain a mixed powder in the form of slurry having a viscosity of 15 poise, as a silicon carbide powder.

This mixed powder in the form of slurry was cast into a gypsum mold having a length of 60 mm, a width of 10 mm and a thickness of 5 mm, and naturally dried at 22° C. for 24 hours, to obtain a green body.

Next, the resulted green body was heated up to 1800° C. under a vacuum atmosphere, and temporarily-sintered at the above-mentioned temperature for 1 hour to obtain a temporarily-sintered body.

Then, a Si impregnation treatment was conducted at 1540° C. using metal silicon as a Si source, to obtain a reaction sintered body jig.

On the resulted reaction sintered body jig, molding processing was performed to form grooves having a depth of 30 mm at an interval of 6 mm using a machining center equipped with a diamond grinder having a width of 3 mm, and precision processing was performed to obtain a silicon carbide reaction sintered body jig.

(Evaluation)

On the silicon carbide sintered bodies resulted in Examples 1 and 2 and Comparative Example 1, processing time as an index showing a processing property, and density (peripheral density, central density) were measured.

The density of silicon carbide sintered body was measured according to JIS R1634 using an Archimedes's method. The resulted test results are shown in Table 1.

TABLE 1

| | | Condition | | Result | | |
|---|---|---|---|---|---|---|
| | | | | Processing | reaction sintered body jig | |
| | Temporarily molding | C impregnation | Si impregnation | time [minute] | density [g/cm³] peripheral | center |
| Example | 1 done | not done | done | 0.2 | 2.91 | 2.91 |
| | 2 done | done | done | 0.2 | 3.15 | 3.10 |
| Comparative Example | 1 not done | not done | done | 20 | 2.91 | 2.91 |

From the above-described results, the following matters were confirmed.

Groove cutting took 20 minutes in the comparative example, however, in Examples 1 and 2, grooves could be cut in 0.2 minutes. Dimension precision in Examples 1 and 2 was within ±0.05 mm both in groove width and pitch. By this, it was confirmed that processing time could be significantly shortened while maintaining dimension precision.

Further, from the results of Example 2, it was confirmed that surface density is improved by forming a silicon carbide sintered body jig via a process of forming a carbon rich layer.

[Method of Producing SiC Boat]

Subsequently, a method of producing a SiC boat will be illustrated referring to Examples 3 and 4 and Comparative Example 2. Please refer to FIG. 1 for Example 3 and to FIG. 2 for Example 4.

Example 3

First, a high purity silicon carbide powder having a central particle size of 1.1 μm (silicon carbide having an impurity content of 5 ppm or less produced according to a production method described in JP-A No. 9-48605) was used as a silicon carbide powder. To this silicon carbide powder was added a phenol resin as a carbon source in given amount according to a conventionally known method, water, deflocculant and binder, respectively, further, they were dispersed and mixed in a ball mill for 24 hours, to obtain a mixed powder in the form of slurry having a viscosity of 50 poise.

This mixed powder in the form of slurry was cast into a gypsum mold, and naturally dried at 22° C. for 24 hours and dried at 110° C., then, machine processing into given form was conducted, to obtain a green body composed of constituent parts of an upper plate, lower plate and struts. The resulted green body was heated up to 1800° C. under a vacuum atmosphere, and temporarily-sintered at the above-mentioned temperature for 1 hour to obtain a temporarily-sintered body A.

Next, on the struts of the resulted temporarily-sintered body A, temporarily-molding processing was performed to form grooves, at 125 places, having a width of 3 mm and a depth of 8 mm at an interval of 6.35 mm using center equipped with a diamond grinder.

The parts constituting the temporarily-molded body A were mutually connected using the above-mentioned mixed powder in the form of slurry as glue, to obtain a temporarily-molded body B.

The temporarily-molded body B was immersed into an acrylonitrile-containing solution as a carbon source and temporarily-sintered at 1800° C. under a vacuum atmosphere, for impregnation of a carbon source into the resulted temporarily-molded body B, to obtain a temporarily-molded body C.

Then, a Si impregnation treatment was conducted at 1540° C. using metal silicon as a Si source. Then, Si was coated on the surface of the temporarily-molded body C by conducting CVD treatment according to a conventionally known method, and carbon on the surface of the temporarily-molded body C and the above-mentioned Si were reacted under heat at 1600° C. to obtain a SiC boat equipped with a surface rich layer.

Example 4

A SiC boat was obtained in the same manner as in Example 1 excepting that a SiC rich layer was not formed on the surface of the temporarily-molded body C by CVD treatment.

Example 5

A SiC boat was obtained in the same manner as in Example 3 excepting that a SiC rich layer was formed on the surface of the above-mentioned carbon source-impregnated temporarily-molded body C by CVD treatment, without conducting impregnation treatment of metal silicon at 1540° C.

Comparative Example 2

A SiC boat was obtained in the same manner as in Example 3 excepting that silicon was impregnated into the temporarily-molded body B without carbon impregnation, groove processing was conducted after completion of a SiC boat, and a SiC rich layer was not formed on the surface of the temporarily-molded body C by CVD treatment.

(Evaluation)

On the silicon carbide sintered bodies resulted in Examples 3 and 4 and Comparative Example 2, average processing time necessary to process a groove as an index showing a processing property, and density (peripheral density, central density) were measured. The density of silicon carbide sintered body was measured according to JIS R1634 using an Archimedes's method. The resulted test results are shown in Table 2.

TABLE 2

| | | Condition | | | Result | | | |
|---|---|---|---|---|---|---|---|---|
| | Groove processing of temporarily-sintered body | C impregnation | Si impregnation | SiC rich layer | Average processing time (min) | corrosion resistance | density [g/cm³] peripheral | center |
| Example 3 | done | done | done | done | 0.8 | excellent | 3.15 | 3.10 |
| Example 4 | done | done | done | not done | 0.9 | good | 3.10 | 3.10 |
| Example 5 | done | done | not done | done | 0.9 | excellent | 3.18 | 2.60 |
| Comparative Example 2 | not done | not done | done | not done | 78 | bad | 2.91 | 2.91 |

From the above-described results, the following matters were confirmed.

Groove cutting took 78 minutes in the comparative example, however, in Examples 3 and 4, grooves could be cut in 0.8 minutes and 0.9 minutes, respectively. Dimension precision in Examples 1 and 2 was within ±0.05 mm both in groove width and pitch. By this, it was confirmed that processing time could be significantly shortened while maintaining dimension precision.

Further, it was confirmed that surface density and corrosion resistance are improved by forming a SiC rich layer.

INDUSTRIAL APPLICABILITY

The present invention performs the following action effects by the above-mentioned constitution.

According to the first aspect of the invention, molding processing time of a silicon carbide sintered body can be shortened by obtaining a silicon carbide sintered body via molding of a temporarily-sintered body having given strength. Further, a silicon carbide sintered body jig having high purity and high corrosion resistance is obtained.

According to the second aspect of the invention, corrosion resistance on the surface of a SiC boat is improved. Processing time can be shortened and processing equipment can be simplified by improvement in processability of a SiC boat.

Those skilled in the art would understand that the above-mentioned matters are preferable embodiments of the present invention and a lot of variations and modifications can be carried out without deviating from the spirit and range of the present invention.

What is claimed is:

1. A method of producing a silicon carbide sintered body jig using a reaction sintering method, comprising:
   (a) dispersing a silicon carbide powder and a phenol resin in a solvent, to produce a mixed powder in the form of slurry,
   (b) pouring the resulted mixed powder into a mold and drying this to obtain a green body,
   (c) temporarily-sintering the resulted green body under a vacuum atmosphere or inert gas atmosphere at 1500° C. to 2000° C., to obtain a temporarily-sintered body,
   (d) temporarily-molding said temporarily-sintered body, to obtain a temporarily-molded body,
   (d-2) impregnating the resulted temporarily-molded body of step (d) with a phenol resin as a carbon source and temporarily-sintering the resulted carbon source impregnated temporarily molded body under a vacuum atmosphere or inert gas atmosphere at 600 to 2000° C.,
   (e) impregnating a melted metal silicon into the impregnated temporarily-molded body of step (d-2) by a capillary phenomenon and reacting free carbon in said temporarily-molded body with silicon sucked into said temporarily-molded body by a capillary phenomenon, to obtain a silicon carbide sintered body, and
   (f) subjecting the resulted silicon carbide sintered body to precise processing, to obtain a silicon carbide sintered body jig.

2. The method of producing a silicon carbide sintered body jig according to claim 1, wherein said silicon carbide powder is said step (a) is a silicon carbide powder obtained by a production method comprising (1) a solidification step in which a silicon compound in the form of liquid, an organic compound in the form of liquid producing carbon by heating, and a polymerization or cross-linking catalyst are uniformly mixed to obtain a mixture which is solidified to obtain a solidified material, and (2) a sintering step in which the resulted solidified material is carbonized with heat under a non-oxidizing atmosphere, then, further sintered under a non-oxidizing atmosphere.

* * * * *